(12) United States Patent
Lee et al.

(10) Patent No.: US 6,673,392 B2
(45) Date of Patent: Jan. 6, 2004

(54) METHOD OF VERTICALLY ALIGNING CARBON NANOTUBES ON SUBSTRATES AT LOW PRESSURE USING THERMAL CHEMICAL VAPOR DEPOSITION WITH DC BIAS

(75) Inventors: Young-hee Lee, Jeollabuk-do (KR); Nae-sung Lee, Seoul (KR); Jong-min Kim, Kyungki-do (KR)

(73) Assignees: Samsung SDi Co., Ltd., Kyungki-do (KR); Young-hee Lee, Jeonju (KR)

( * ) Notice: Subject to any disclaimer, the term of this patent is extended or adjusted under 35 U.S.C. 154(b) by 454 days.

(21) Appl. No.: 09/808,011

(22) Filed: Mar. 15, 2001

(65) Prior Publication Data

US 2001/0024633 A1 Sep. 27, 2001

(30) Foreign Application Priority Data

Mar. 15, 2000 (KR) .......................... 2000-13039

(51) Int. Cl.[7] .................. C23C 16/26; C23C 16/448; C23C 16/503; D01F 9/127
(52) U.S. Cl. .................. 427/249.1; 427/561; 427/562; 427/78; 427/255.28; 427/903; 423/445 B; 423/447.3; 118/723 HC; 118/723 ER
(58) Field of Search ................ 427/561, 562, 427/573, 577, 77, 78, 122, 249.1, 255.28, 255.23, 903; 423/445 R, 445 B, 447.1, 447.3; 118/719, 723 HC, 723 E, 723 ER

(56) References Cited

U.S. PATENT DOCUMENTS

| | | | | |
|---|---|---|---|---|
| 6,232,706 B1 | * | 5/2001 | Dai et al. | 313/309 |
| 6,278,231 B1 | * | 8/2001 | Iwasaki et al. | 313/310 |
| 6,346,189 B1 | * | 2/2002 | Dai et al. | 205/766 |
| 2003/0013372 A1 | * | 1/2003 | Uemura et al. | 445/24 |
| 2003/0059968 A1 | * | 3/2003 | Cheng et al. | 438/20 |

FOREIGN PATENT DOCUMENTS

| | | | |
|---|---|---|---|
| EP | 1 072 693 A1 | * | 1/2001 |
| WO | WO 99/65821 A1 | * | 12/1999 |

OTHER PUBLICATIONS

Cheol Jin Lee et al, "Synthesis of aligned carbon nanotubes using thermal chemical vapor deposition", Chemical Physics Letters, Ocotber 29, 1999, vol. 312, No. 5–6, pp. 461–468.

* cited by examiner

Primary Examiner—Shrive P. Beck
Assistant Examiner—Wesley Markham
(74) Attorney, Agent, or Firm—Burns, Doane, Swecker & Mathis, LLP

(57) ABSTRACT

A method of vertically aligning pure carbon nanotubes on a large glass or silicon substrate at a low temperature using a low pressure DC thermal chemical vapor deposition method is provided. In this method, catalytic decomposition with respect to hydro-carbon gases is performed in two steps. Basically, an existing thermal chemical vapor deposition method using hydro-carbon gases such as acetylene, ethylene, methane or propane is used. To be more specific, the hydro-carbon gases are primarily decomposed at a low temperature of 400–500° C. by passing the hydro-carbon gases through a mesh-structure catalyst which is made of Ni, Fe, Co, Y, Pd, Pt, Au or an alloy of two or more of these materials. Secondly, the catalytically- and thermally-decomposed hydro-carbon gases pass through the space between a carbon nanotube growing substrate and an electrode substrate made of Ni, Fe, Co, Y, Pd, Pt, Au or an alloy of two or more of these materials or an electrode substrate on which Ni, Fe, Co, Y, Pd, Pt, Au or an alloy of two or more of these materials is thinly deposited by sputtering or electron-beam evaporation, the space to which DC voltage has been applied.

9 Claims, 4 Drawing Sheets

US 6,673,392 B2

METHOD OF VERTICALLY ALIGNING CARBON NANOTUBES ON SUBSTRATES AT LOW PRESSURE USING THERMAL CHEMICAL VAPOR DEPOSITION WITH DC BIAS

Priority is claimed to Korean Patent Application No. 00-13039 filed on Mar. 15, 2000, herein incorporated by reference.

BACKGROUND OF THE INVENTION

1. Field of the Invention

The present invention relates to a method of vertically aligning pure carbon nanotubes by low temperature thermal chemical vapor deposition with direct current (DC) bias, by which high-quality carbon nanotubes for field emission display (FED) are deposited on a large area silicon or glass substrate at a low temperature to have a large area.

2. Description of the Related Art

Carbon nanotubes, which receive much attention of late, are hollow, long in length in contrast to a short diameter of several tens of nm, and stable chemically and dynamically in structure. Thus, carbon nanotubes are used to form electron emission tips for FED.

Carbon nanotubes are recommended to be vertically aligned and grown on a large substrate to be used as an FED electron emission tip material. In the prior art, screen printing has been used to vertically align carbon nanotubes, but there is difficulty in evenly distributing or vertically aligning carbon nanotubes.

At present, attempts to solve the above problem by growing carbon nanotubes directly on a substrate to be vertically aligned have been actively carried out. If carbon nanotubes can be vertically aligned on a glass substrate to have a large area, they can be applied directly to FEDs, thereby lowering a turn-on voltage and reducing the production costs due to a cut in process steps.

The above problem can be solved by a carbon nanotube growing method using a thermal chemical vapor deposition technique in which carbon nanotubes are grown on a substrate using hydro-carbon carbide gas such as $CH_4$, $C_2H_2$, $C_2H_4$ or $C_2H_5OH$ at a high temperature. However, according to this method, the growth temperature of carbon nanotubes is high at 900° C. or greater.

Alternative to the above method is a method of lowering the growth temperature by depositing a transition metal on an Si or glass substrate to form a nuclear grain and also bring about catalysis. However, even in this alternative, there is difficulty in obtaining high-quality uniform carbon nanotubes at a low temperature of 600° C. or less over a large area. In a chemical deposition method using plasma, the growth temperature can be lowered by a certain degree, but there is difficulty in obtaining carbon nanotubes over a large area.

According to techniques known up to now, carbon nanotubes can be grown on a substrate of up to 2" inches at a growth temperature of about 660° C. using a thermal chemical vapor deposition apparatus. Also, carbon nanotubes are successfully obtained at a low temperature of 550° C. or less by a catalytic reaction caused by a palladium transition metal plate installed around the surface of a substrate on which carbon nanotubes are to be grown. However, there are drawbacks such as bad uniformity and generation of defective non-aligned carbon nanotubes. Also, since there are carbonaceous particles not changed into carbon nanotubes, carbon nanotubes cannot be directly used as an FED electron emission material.

SUMMARY OF THE INVENTION

To solve the above problems, an objective of the present invention is to provide a method of growing high-quality carbon nanotubes for field emission display (FED) on a silicon or glass substrate at a low temperature over a large area by solving the difficulty of a conventional thermal chemical vapor deposition apparatus in growing carbon nanotubes at a low temperature.

To achieve the above objective, the present invention provides a thermal chemical vapor deposition method to vertically align carbon nanotubes on a substrate using hydro-carbon gases, the method including, (a) catalytically thermally decomposing the hydrogen carbide gas at a temperature no greater than 600° C. by passing the hydro-carbon gases through a mesh which is made of Ni, Fe, Co, Y, Pd, Pt, Au or an alloy of two or more of these materials or on which Ni, Fe, Co, Y, Pd, Pt, Au or an alloy of two or more of these materials is deposited; and (b) decomposing catalytically- and thermally-decomposed hydro-carbon gases by applying DC voltage to the space between a carbon nanotube growing substrate and an electrode substrate which is made of Ni, Fe, Co, Y, Pd, Pt, Au or an alloy of two or more of these materials or on which Ni, Fe, Co, Y, Pd, Pt, Au or an alloy of two or more of these materials is deposited.

Preferably, the hydro-carbon gases are methane, ethylene, acetone or propane, and the DC voltage is applied in a state where the carbon nanotube growing substrate is separated several mm apart from the electrode substrate.

Preferably, Ni, Fe, Co, Y, Pd, Pt, Au or an alloy of two or more of these materials is deposited on the electrode substrate or the carbon nanotube growing substrate by RF magnetron sputtering or electron beam evaporation, after Ti or TiN is deposited.

Preferably, several electrode substrates and an equal number of carbon nanotube growing substrates are mounted on an electrode substrate holder and a carbon nanotube growing substrate holder, respectively, and the DC voltage is applied to the space between the electrode substrates and the carbon nanotube growing substrate via a feedthrough. Also, it is preferable that the pressure within a reaction chamber is lowered to several motor during growing the carbon nanotubes.

Preferably, the carbon nanotube growing substrate is pre-treated using $NH_3$ gas before the carbon nanotubes are grown.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENT

Figure 1:
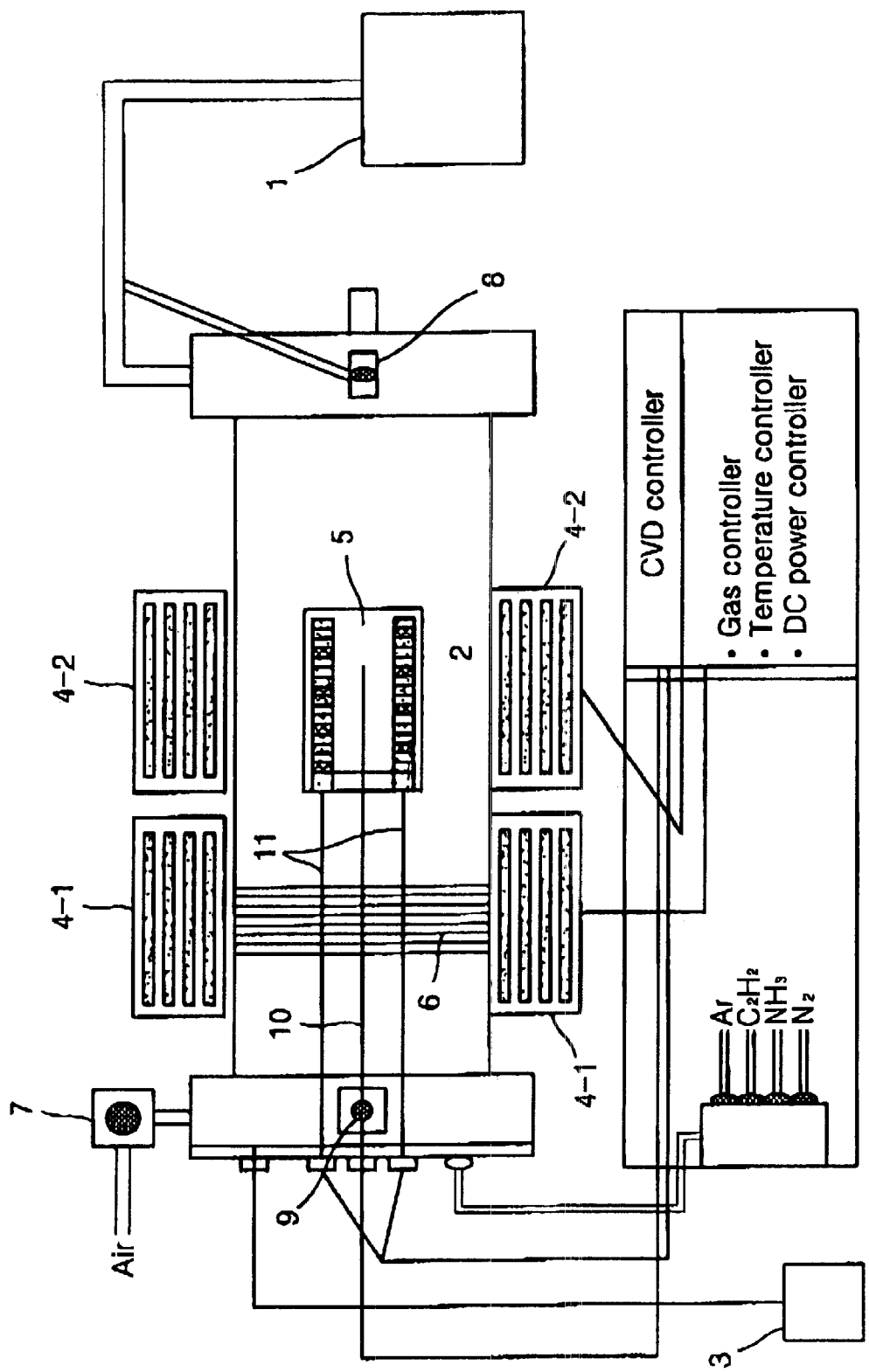
FIG. 1 is a schematic view of thermal chemical vapor deposition apparatus including a thermal decomposition apparatus for applying direct current (DC) voltage, which is used when a method of vertically aligning carbon nanotubes, according to the present invention, is performed.

Referring to FIG. 1, a thermal chemical vapor deposition apparatus according to the present invention has a quartz chamber 2, which is a reaction chamber, around which heating zones 4-1 and 4-2 made up of hot wires are installed and which is connected to a vacuum pump 1. Here, the quartz chamber is connected to gas lines through which a purging gas and a reactive gas are introduced. Similar to typical vacuum equipment, the above-described thermal chemical vapor deposition apparatus is made up of gauges 3 and 9 for measuring vacuum, a thermocouple for measuring the temperature, and valves for maintaining a certain pressure. In a conventional thermal chemical vapor deposition method, carbon nanotubes are grown on a substrate at a high temperature using hydro-carbon gases such as $CH_4$, $C_2H_2$, $C_2H_4$ or $C_2H_5OH$. However, this method usually requires a high growth temperature of 900° C. or more, so that growth at a low temperature is difficult. In the present invention, the difficulty of a conventional thermal chemical vapor deposition apparatus in growing carbon nanotubes at a low temperature is solved to grow high-quality carbon nanotubes for field emission display (FED) on a silicon or glass substrate at a low temperature over a large area. The present invention provides a two-step catalytic thermal decomposition method for vertically aligning carbon nanotubes by lowering the temperature at which hydro-carbon gases are decomposed using a catalyst and applying a DC voltage to between two facing substrates to accelerate the low gas diffusing speed during low-temperature growth so that gas ions within decomposed gas are diffused in the direction perpendicular to a substrate.

In the present invention, a two-step catalytic decomposition process is performed in an apparatus which performs catalytic thermal decomposition (a) and DC voltage application (b). Thus, high-quality carbon nanotubes can be evenly and vertically grown on a large Si or glass substrate even at a low temperature no greater than 600° C., and the length of carbon nanotubes can be easily controlled.

In FIG. 1, reference numeral 1 denotes a rotary pump, reference numeral 2 denotes a quartz chamber, reference numeral 3 denotes a convector gauge, reference numeral 4-1 denotes a first heating zone, reference numeral 4-2 denotes a second heating zone, reference numeral 5 denotes a substrate holder, reference numeral 6 denotes an iron mesh, reference numeral 7 denotes a vent valve, reference numeral 8 denotes a throttle valve, reference numeral 9 denotes a vacuum gauge, reference numeral 10 denotes a thermocouple, and reference numeral 11 denotes a DC electrode.

In an embodiment of the two-step catalytic thermal decomposition method according to the present invention, in the first step, hydro-carbon gases passes through the mesh 6 which is made of at least one material among Ni, Fe, Co, Y, Pd, Pt, Au and an alloy of two or more of these materials or on which at least one among the above materials is deposited, thereby thermally decomposing the hydro-carbon gases using a catalyst at a temperature of about 400–500° C. Here, the above materials have a catalytic capability of producing carbon particles by decomposing hydro-carbon gases.

Figure 2:
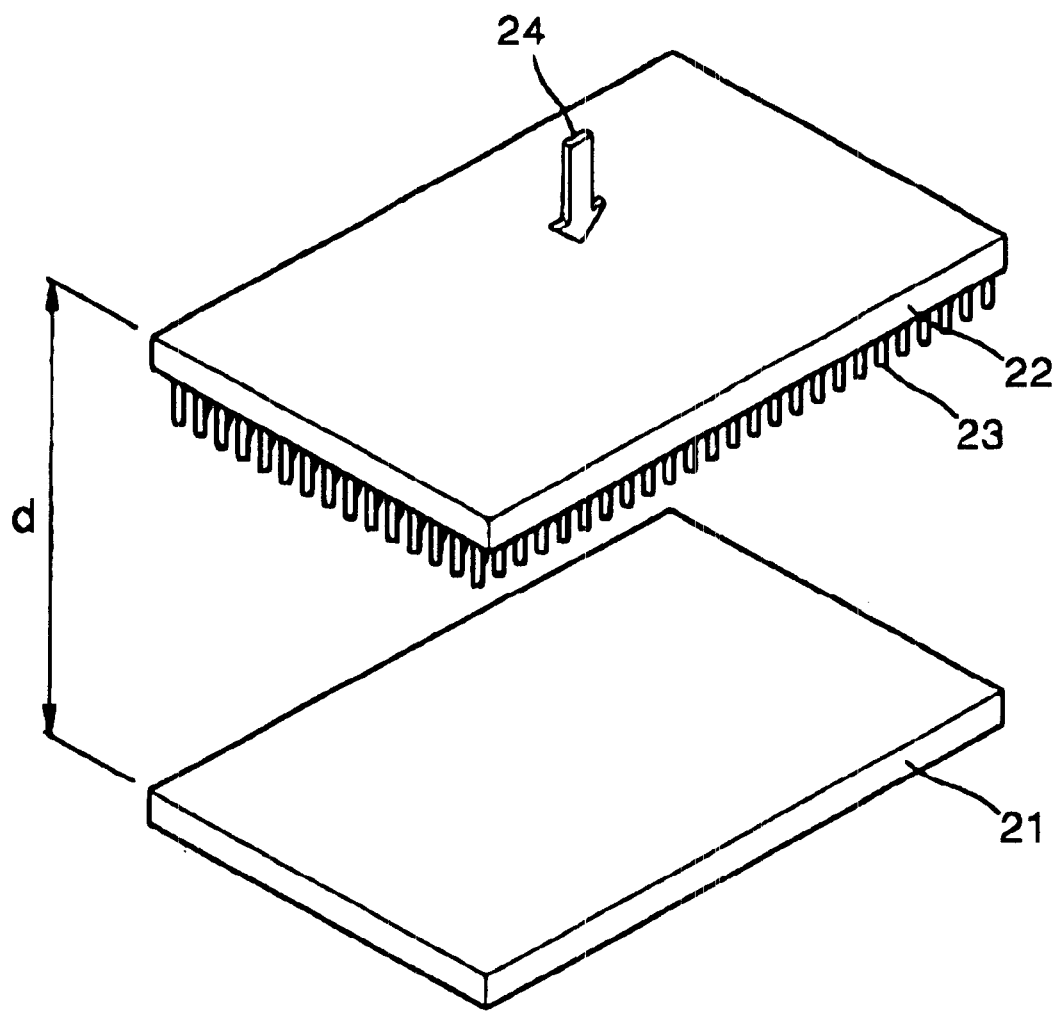
FIG. 2 is a schematic view illustrating a method of vertically aligning carbon nanotubes by catalytic thermal decomposition in a structure where an electrode substrate is spaced a predetermined distance apart from a substrate on which carbon nanotubes are grown.

Referring to FIG. 2, in the second step, a substrate 22 on which carbon nanotubes 23 are grown is positioned a predetermined distanced apart over an electrode substrate 21 which is made of at least one material among Ni, Fe, Co, Y, Pd, Pt, Au and an alloy of two or more of these materials or on which at least one material among Ni, Fe, Co, Y, Pd, Pt, Au and an alloy of two or more of these materials is deposited. Next, hydro-carbon gases 24 are decomposed at a low temperature using the catalytic material of the electrode substrate 21, and again decomposed by DC voltage applied to the space between the electrode substrate 21 and the carbon nanotube growing substrate 22 via a feedthrough.

In order to increase the adhesion of Ni, Fe, Co, Y, Pd, Pt, Au or an alloy of two or more of these materials to prevent these materials from peeling off the electrode substrate and the carbon nanotube growing substrate during growing carbon nanotubes, Ti or TiN is deposited on a flat substrate such as an Si substrate, a glass substrate or an oxide substrate at 1000° C. or less by RF magnetron sputtering or electron beam evaporation before a thin catalytic metal film of Ni, Fe, Co, Y, Pd, Pt, Au or an alloy of two or more of these materials is deposited on the flat substrate at 1000° C. or less by the same method. Alternatively, a substrate made of one among the above materials can be used.

The shapes of grains of Ni, Fe, Co, Y, Pd, Pt, Au or an alloy of two or more of these materials deposited on a carbon nanotube growing substrate are controlled by $NH_3$ gas introduced before hydro-carbon gases are injected, thereby forming the nuclear grains of carbon nanotubes. Then, the hydro-carbon gases flow in at a rate of 100 sccm or less while the internal pressure of the chemical thermal deposition apparatus is maintained at or below several torr, and $NH_3$ gas also flows in at a rate of 100 sccm or less for several tens of minutes, thereby growing carbon nanotubes.

Figure 3A:
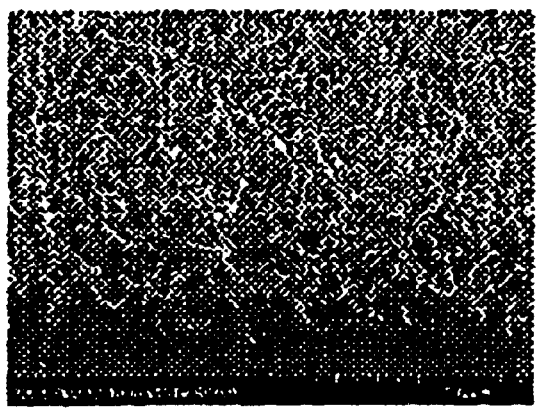
FIGS. 3A and 3B are scanning emission microscopy (SEM) images of carbon nanotubes grown by typical thermal decomposition using only the temperature.
Figure 3B:
Figure 4A:
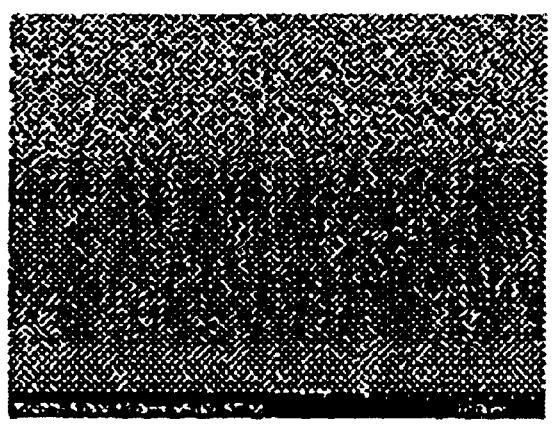
FIGS. 4A and 4B are SEM images of vertically-aligned carbon nanotubes according to the present invention.
Figure 4B:

FIGS. 3A and 3B are scanning emission microscopy (SEM) images of carbon nanotubes grown by a typical thermal chemical vapor deposition technique. FIGS. 3A and 3B show carbon nanotubes grown for about 20 minutes by thermally decomposing hydro-carbon gases using only the temperature of about 600° C. without using an electrode substrate on which a catalyst has been deposited. In this case, a pre-treatment using $NH_3$ gas was performed for about 7 minutes, the growth pressure was about 5.5 torr, and $C_2H_2$ and $NH_3$ gases were used. In FIGS. 3A and 3B, hydro-carbon gases wire deposited by a typical thermal chemical vapor deposition technique which depends on only the temperature, resulting in randomly-grown carbon nanotubes as can be seen from FIGS. 3A and 3B. FIGS. 4A and 4B are SEM images of carbon nanotubes grown by thermal decomposition using a catalytic material Pd in a structure where an Si substrate on which a highly-adhesive material Ti and a catalytic material Pd have been sequentially deposited is positioned 1 cm down from a carbon nanotube growing substrate in parallel. In this embodiment, the growth temperature was about 600° C. The pre-treatment using $NH_3$, the growth pressure, the gases used, the length of carbon nanotube growing duration in FIGS. 4A and 4B are the same as those of FIGS. 3A and 3B. However, in contrast to FIGS. 3A and 3B, the carbon nanotubes of FIGS. 4A and 4B were grown by a catalytic thermal decomposition process. Thus, it can be seen from FIGS. 4A and 4B that carbon nanotubes were vertically aligned when hydro-carbon gases are effectively thermally-decomposed using a Pd catalyst.

The length of vertically-aligned carbon nanotubes can be controlled using the duration of growth, and the diameter of carbon nanotubes is determined according to the size of formed grains.

The pressure during growth is maintained low at several mtorr, which increases the length of carbon grains adsorbed to a substrate and diffused. This helps formation of the nuclei of carbon nanotubes during low-temperature growth, thereby ultimately improving the uniformity of a carbon nanotube substrate.

As described above, in the low pressure DC thermal chemical vapor deposition method according to the present invention made up of a catalytic thermal deposition step and a DC voltage applying step, high-quality carbon nanotubes can be uniformly vertically aligned on a large Si or glass substrate even at a low temperature of 600° C. or less, and the length of the carbon nanotubes can be easily controlled.

In particular, since gas is evenly diffused by a mesh structure made of Ni, Fe, Co, Y, Pd, Pt, Au or an alloy of two or more of these materials or a mesh structure on which Ni, Fe, Co, Y, Pd, Pt, Au or an alloy of two or more of these materials is thinly deposited, the gas is also supplied to all over a large substrate.

Ti or TiN is thinly deposited before Ni, Fe, Co, Y, Pd, Pt, Au or an alloy of two or more of these materials is deposited on an electrode substrate or a carbon nanotube growing substrate, thereby increasing the adhesion between the Si or glass substrate and Ni, Fe, Co, Y, Pd, Pt, Au or an alloy of two or more of these materials. A sufficient period of diffusion time is required to change carbon particles to carbon nanotubes during growth at a low temperature of 600° C. or less. However, when carbon nanotubes are grown at a pressure close to an atmospheric pressure, adsorption of carbon species mostly occurs, thereby reducing the diffusion length. Thus, low-pressure chemical vapor deposition is necessary particularly in the case of growth at a low temperature.

The thus-grown large carbon nanotube substrate can be applied directly to FEDs, lower the turn-on voltage for electron emission, simplify the process of manufacturing an FED, and significantly reduce the manufacturing costs of FEDs. Furthermore, an electrode substrate holder and a carbon nanotube growing substrate holder are designed to mount several electrode substrates and several carbon nanotube growing substrates simultaneously, whereby the productivity is increased.

What is claimed is:

1. A thermal chemical vapor deposition method to vertically align carbon nanotubes on a substrate using hydro-carbon gases, the method comprising:

(a) catalytically thermally decomposing the hydro-carbon gases at a temperature no greater than 600° C. by passing the hydro-carbon gases through a mesh which is made of Ni, Fe, Co, Y, Pd, Pt, Au or an alloy of two or more of these materials or on which Ni, Fe, Co, Y, Pd, Pt, Au or an alloy of two or more of these materials is deposited; and (b) decomposing catalytically—and thermally-decomposed hydro-carbon gases by applying DC voltage to the space between a carbon nanotube growing substrate and an electrode substrate which is made of Ni, Fe, Co, Y, Pd, Pt, Au or an alloy of two or more of these materials or on which Ni, Fe, Co, Y, Pd, Pt, Au or an alloy of two or more of these materials is deposited.

2. The thermal chemical vapor deposition method of claim 1, wherein the hydro-carbon gases are at least one gas selected from the group consisting of methane, ethylene, acetone and propane.

3. The thermal chemical vapor deposition method of claim 2, wherein a material selected from the group consisting of Ni, Fe, Co, Y, Pd, Pt, Au and an alloy of two or more of these materials is deposited on one of the electrode substrate and the carbon nanotube growing substrate after one of Ti and TiN is deposited.

4. The thermal chemical vapor deposition method of claim 1, wherein a material selected from the group consisting of Ni, Fe, Co, Y, Pd, Pt, Au and an alloy of two or more of these materials is deposited on one of the electrode substrate and the carbon nanotube growing substrate after one of Ti and TiN is deposited.

5. The thermal chemical vapor deposition method of claim 4, wherein the pressure within a reaction chamber is lowered to several mtorr during growing the carbon nanotubes.

6. The thermal chemical vapor deposition method of claim 5, wherein a thin film of a material selected from the group consisting of Ni, Fe, Co, Y, Pd, Pt, Au and an alloy of two or more of these materials on the carbon nanotube growing substrate is pre-treated using $NH_3$ gas before the carbon nanotubes are grown.

7. The thermal chemical vapor deposition method of claim 6, wherein several electrode substrates and an equal number of carbon nanotube growing substrates are mounted on an electrode substrate holder and a carbon nanotube growing substrate holder, respectively, the electrode substrates are positioned opposite to the carbon nanotube growing substrates, and the DC voltage is applied to the space between the electrode substrates and the carbon nanotube growing substrates via a feedthrough.

8. The thermal chemical vapor deposition method of claim 1, wherein the DC voltage is applied in a state where the carbon nanotube growing substrate is separated several mm apart from the electrode substrate.

9. The thermal chemical vapor deposition method of claim 8, wherein a material selected from the group consisting of Ni, Fe, Co, Y, Pd, Pt, Au and an alloy of two or more of these materials is deposited on one of the electrode substrate and the carbon nanotube growing substrate after one of Ti and TIN is deposited.

* * * * *